United States Patent
Schmid et al.

(10) Patent No.: US 6,913,473 B2
(45) Date of Patent: Jul. 5, 2005

(54) POWER SUPPLY FOR AN ELECTRICAL APPLIANCE

(75) Inventors: Michael Schmid, Dillingen (DE); Bernhard Kannler, Augsburg (DE)

(73) Assignee: Fujitsu Siemens Computers GmbH, Munich (DE)

( * ) Notice: Subject to any disclaimer, the term of this patent is extended or adjusted under 35 U.S.C. 154(b) by 0 days.

(21) Appl. No.: 10/701,026

(22) Filed: Nov. 4, 2003

(65) Prior Publication Data

US 2004/0092144 A1 May 13, 2004

(30) Foreign Application Priority Data

Nov. 13, 2002 (DE) .......................................... 102 52 829

(51) Int. Cl.[7] .............................................. H01R 13/44
(52) U.S. Cl. ..................... 439/136; 439/911; 361/727
(58) Field of Search ................................ 439/135, 136, 439/142–145, 147, 911; 361/724–727, 683, 610, 679; 312/223.1, 223.2

(56) References Cited

U.S. PATENT DOCUMENTS

| 5,735,701 | A | | 4/1998 | Jarrett | |
| 6,081,419 | A | * | 6/2000 | Pham | .......................... 361/725 |
| 6,439,917 | B2 | * | 8/2002 | Tonozuka | ................... 439/911 |

FOREIGN PATENT DOCUMENTS

| DE | 197 43 045 C2 | 4/1999 |
| DE | 199 19 591 C2 | 1/2001 |

* cited by examiner

Primary Examiner—Gary Paumen
Assistant Examiner—Felix O. Figueroa
(74) Attorney, Agent, or Firm—Laurence A. Greenberg; Werner H. Stemer; Ralph E. Locher

(57) ABSTRACT

A power supply for an electrical appliance has a female connector for an electrical plug, in which case the power supply can be removed from the electrical appliance for installation or servicing purposes. In order to prevent electrical connection of the power supply when it is in the removed state, the power supply is provided with an insertion protection device, which prevents insertion of the electrical plug when the power supply is in the removed state.

9 Claims, 6 Drawing Sheets

POWER SUPPLY FOR AN ELECTRICAL APPLIANCE

BACKGROUND OF THE INVENTION

Field of the Invention

The invention relates to a power supply for an electrical appliance. The power supply has a female connector for connecting to an electrical plug, in which case the power supply can be removed from the electrical appliance for servicing purposes.

Particularly in the case of small computers, the power supply has to be removed in order, for example, to allow the motherboard to be replaced.

For some servicing work, such as replacement of the drives, it is not absolutely essential to remove the power supply, although it is advantageous, since access to the drives is often considerably easier when the power supply has been removed.

In most computers that are currently commercially available, the power supply need not be removed in order to replace the motherboard. In other models, it is connected to the chassis such that it can be pivoted to the side in order to replace the motherboard for servicing work.

However, in the case of appliances in which the power supply can be removed, there is a risk of the power supply being connected to the electrical cable when it is in the removed state.

Some servicing technicians practice this in order, for example, to check the serviceability of the newly installed motherboard with the power supply removed as well. However, a power supply is not configured for operation outside the computer housing, so that this results in considerable potential danger when the power supply is connected to the mains system when it is in the removed state.

SUMMARY OF THE INVENTION

It is accordingly an object of the invention to provide a power supply for an electrical appliance that overcomes the above-mentioned disadvantages of the prior art devices of this general type, which reduces potential danger when connecting up the power supply.

With the foregoing and other objects in view there is provided, in accordance with the invention, a power supply for an electrical appliance. The power supply contains a female connector for receiving an electrical plug and the power supply can be removed from the electrical appliance for installation or servicing purposes. An insertion protection device is provided for preventing insertion of the electrical plug into the female connector when the power supply is not installed in a correct location of the electrical appliance.

According to the invention, the object is achieved in that the power supply is provided with insertion protection, which prevents the insertion of the electrical plug when the power supply is not installed in the correct location of the electrical appliance.

The insertion protection prevents the removed power supply from being connected to the mains system in a manner that is not intended, thus resulting in a dangerous situation that someone involved would not be able to identify immediately.

Most power supplies that can be removed for servicing and maintenance work have a mounting rack in which the insertion protection device is advantageously implemented by a slide.

The slide is in this case preferably configured such that, when the power supply is in the removed state, the female connector into which the electrical plug can be inserted is at least partially covered.

According to one preferred embodiment, a spring acts on the slide and pushes the slide into a locking position, in which the electrical plug can no longer be inserted into the female connector.

In this case, the spring is advantageously configured such that the slide can be moved out of the locking position only by applying pressure to the spring at two different points. This corresponds to two-hand protection, so that the slide is not released in an unintended manner when the power supply has been removed.

When the power supply is being installed in the electrical appliance, the spring is preferably disposed such that it is automatically released by insertion of the power supply into the electrical appliance, and the slide is also automatically pushed from the locking position to a position in which the electrical plug can be inserted into the female connector.

For this purpose, the housing of the electrical appliance is preferably provided with a holder into which the mounting rack of the power supply can be inserted and which, on the one hand, unlocks the spring, and at the same time one edge of it pushes the slide into the unlocking position.

The slide and the holder for the mounting rack for the power supply are advantageously matched to one another such that it is also impossible to move the mounting rack out of the holder when the electrical plug is inserted.

Other features which are considered as characteristic for the invention are set forth in the appended claims.

Although the invention is illustrated and described herein as embodied in a power supply for an electrical appliance, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
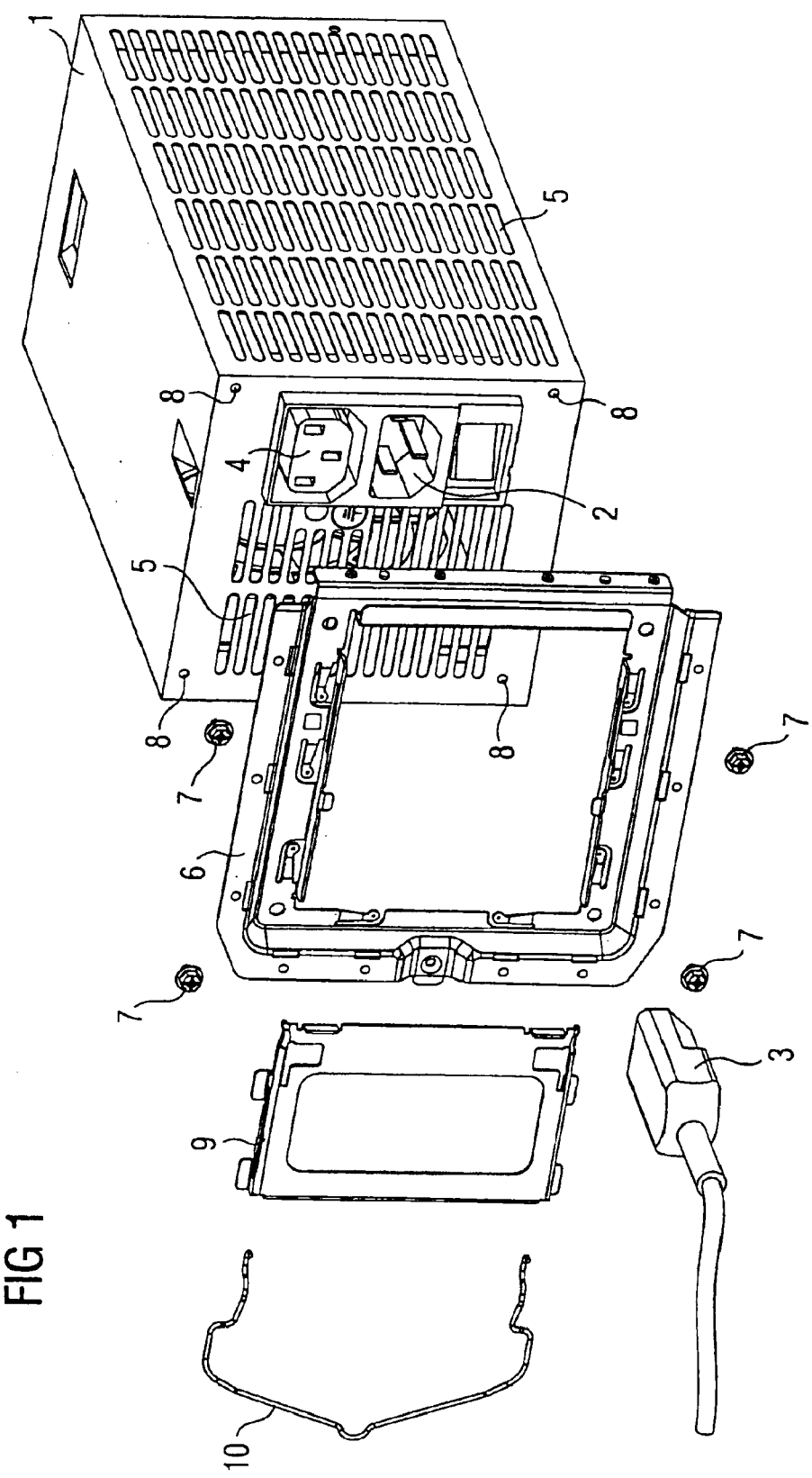
FIG. 1 is a diagrammatic, exploded perspective view of a power supply with a mounting rack.

Referring now to the figures of the drawing in detail and first, particularly, to FIG. 1 thereof, there is shown an exploded view of a power supply 1, as is used for a computer. On its end face, the power supply 1 has a female connector 2, into which a corresponding mains system plug or electrical plug 3 can be inserted in order to supply power. A further female connector 4 is generally positioned above the female connector 2, and is generally used for connection of the power supply for the monitor.

The power supply 1 is provided with a ventilation grating 5 on the end face alongside the female connectors 2 and 4, and on the side surface.

In order to install the power supply 1 in a computer or in some other electrical appliance, the power supply 1 is provided with a mounting rack 6 on the face on which the female connectors 2 and 4 are disposed. In the illustrated exemplary embodiment, the mounting rack 6 is fixed to the power supply 1 by screws 7 in corresponding threaded holes 8.

In order to make it impossible to insert the electrical plug 3 into the female connector 2 when the power supply 1 has been removed, the mounting rack 6 has, according to the invention, a slide 9 which is pushed via a spring 10 into a locking position, in order that the electrical plug 3 cannot be inserted into the female connector 2, when the power supply 1 has been removed.

Figure 2:
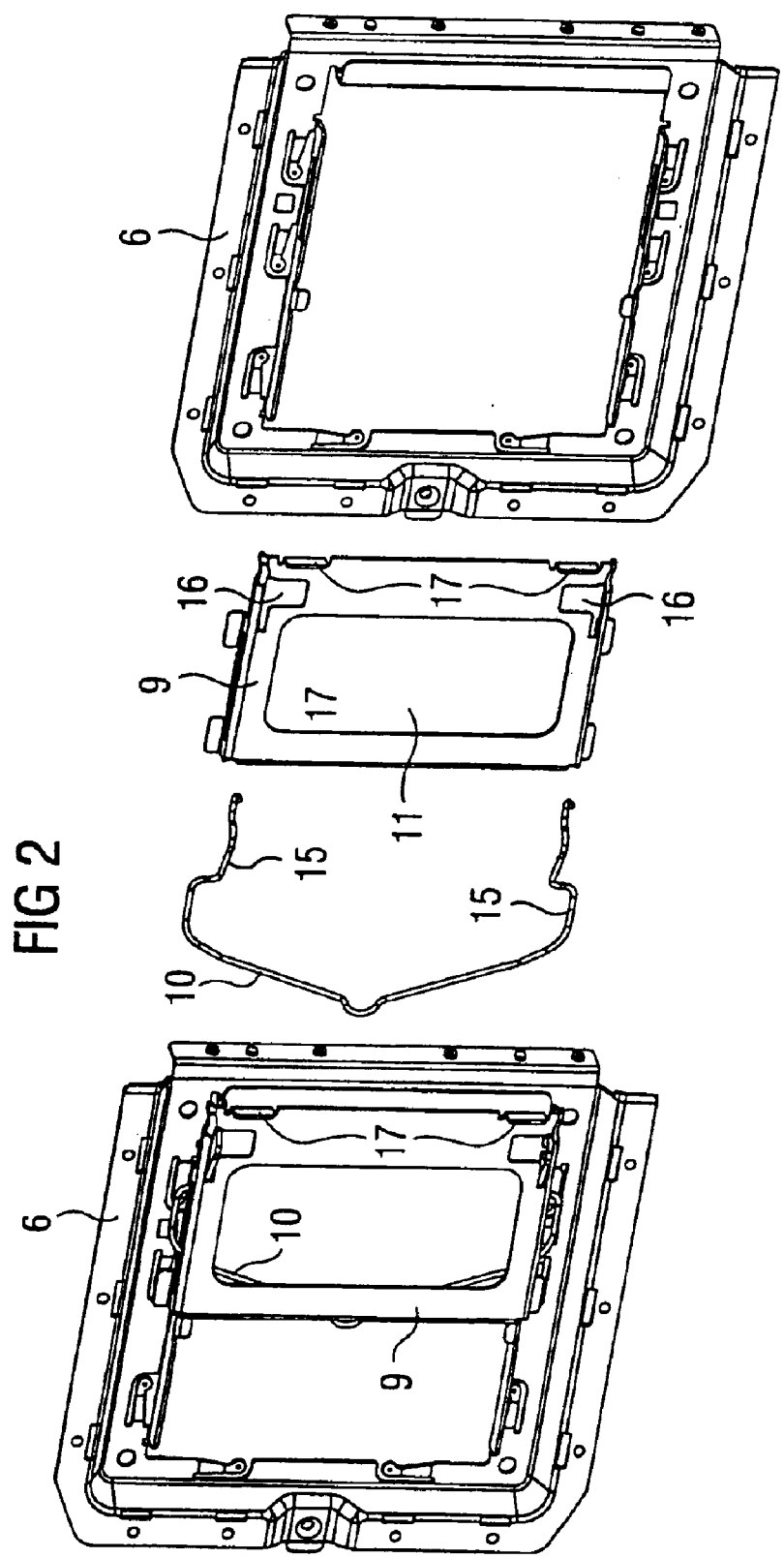
FIG. 2 is an exploded, perspective view of the mounting rack, and an illustration of the mounting rack in the installed state.

FIG. 2 shows the mounting rack 6, the slide 9 and the spring 10 in the installed state, once again in the form of an exploded illustration as in FIG. 1.

Figure 3:
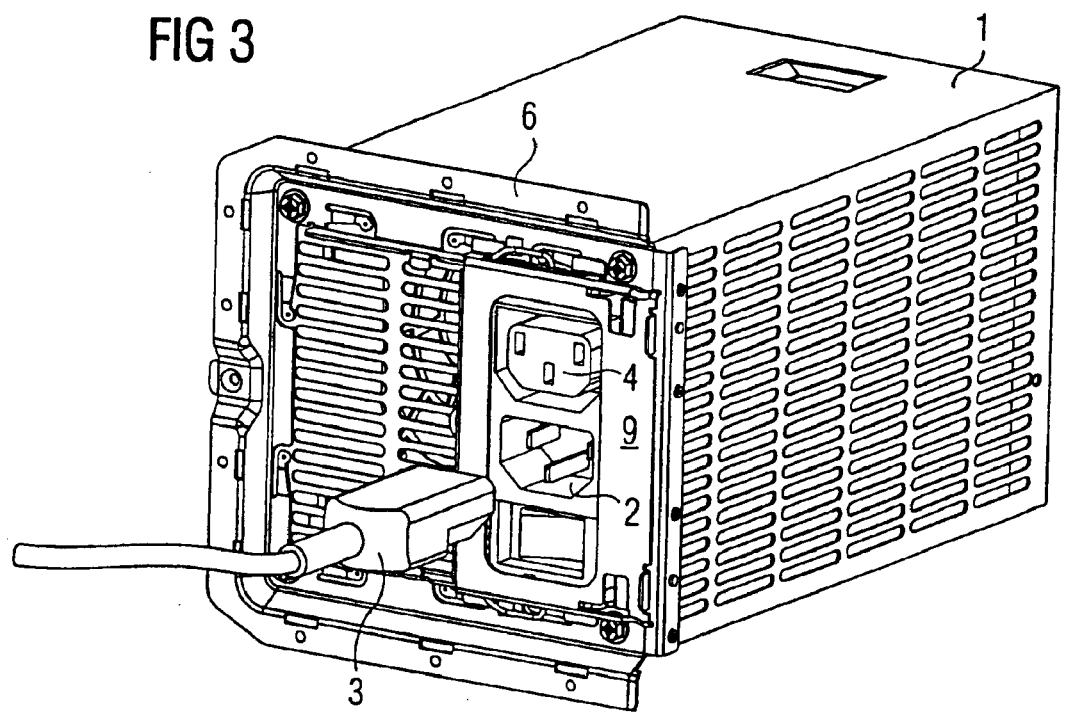
FIG. 3 is a perspective view of a power supply with the mounting rack in an unlocking position.

FIG. 3 shows the power supply 1 with the mounting rack 6 installed and with the slide 9 in the unlocking position, that is to say in the position in which the electrical plug 3 can be inserted into the female connector 2. For this purpose, the slide 9 has an essentially rectangular cutout 11, which surrounds the female connector 2 as well as the further female connector 4, and a voltage range switch for 110V/220V located underneath them.

Figure 4:
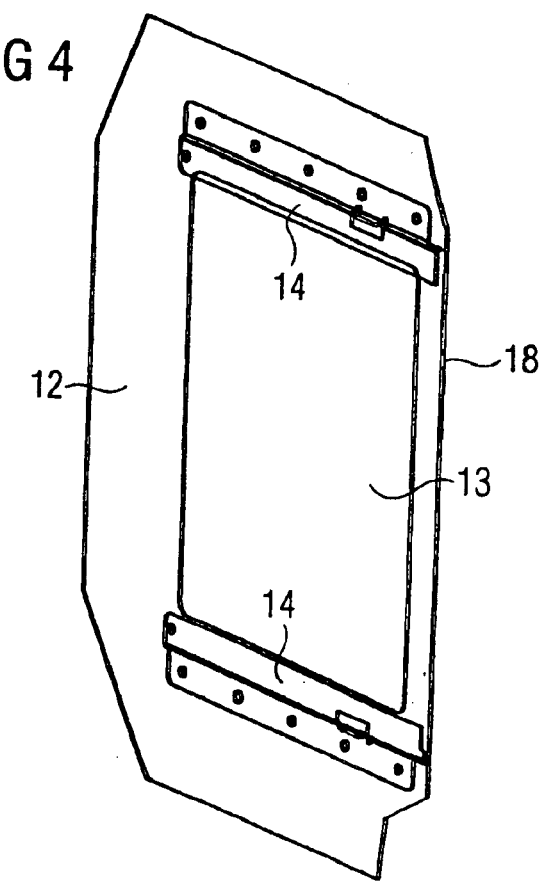
FIG. 4 is a perspective view of a holder for the mounting rack on the housing of an electronic appliance.

FIG. 4 shows a holder 12 as is provided on the inside of a computer housing or of an electrical appliance for fixing the power supply 1 via the mounting rack 6.

For this purpose, the holder 12 has an essentially rectangular cutout 13, which is bounded at the top and bottom by two offset lugs 14, so that the mounting rack 6 can be inserted between the lugs 14 and the holder 12.

For this purpose, the mounting rack 6 is configured in comparison to the external dimensions of the power supply 1 such that it projects at the top and bottom, so that the projecting part can be inserted between the lugs 14 and the holder 12.

During insertion of the mounting rack 6, the surface of the holder 12 interacts with the power supply 1 in order to unlock the slide 9.

Figure 5:
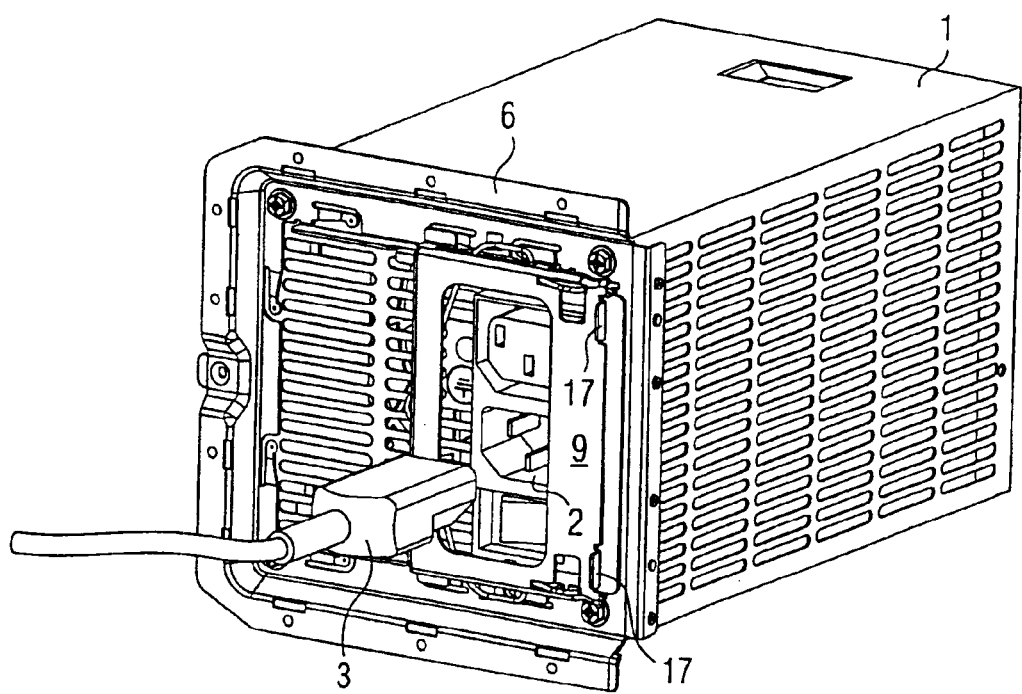
FIG. 5 is a perspective view of the power supply with the mounting rack, with the slide in the locking position.

FIG. 5 shows an illustration corresponding to FIG. 3, but in this case with the slide 9 illustrated in the locking position, in which it would be impossible to insert the electrical plug 3 into the female connector 2.

If, as is illustrated in FIG. 5, the power supply 1 is pushed together with the mounting rack 6 into the holder 12, then the surface of the holder 12 exerts pressure on the spring 10 at the points 15 (see FIG. 2).

As is illustrated in FIG. 2, the slide 9 is held by the spring 10, with the ends of the spring 10 being hooked into corresponding cutouts 16 in the slide 9. Pressure on the points 15 on the spring during insertion of the mounting rack 6 into the holder 12 thus moves the ends out of the cutouts 16, and the slide is released.

The slide 9 has two lugs 17 which project outwards and are moved against an edge 18 of the holder 12 during insertion of the mounting rack 6, which results in the slide 9, when in the locking position as illustrated in FIG. 5, being moved to the unlocking position, as illustrated in FIG. 3. At the same time, as described above, the spring 10 is unlocked via the holder 12, so that it is possible to move the slide 9.

During removal, the mounting rack 6 is withdrawn from the holder 12 as a result of which, beyond a certain point, the unlocking effects of the spring 10 is cancelled and it thus automatically closes the slide 9.

The cutout 13 in the holder 12 and the insertion of the mounting rack 6 into the holder 12 from the side mean that it is also impossible to remove the power supply 1 when the electrical plug 3 has been inserted into the female connector 2.

Figure 6:
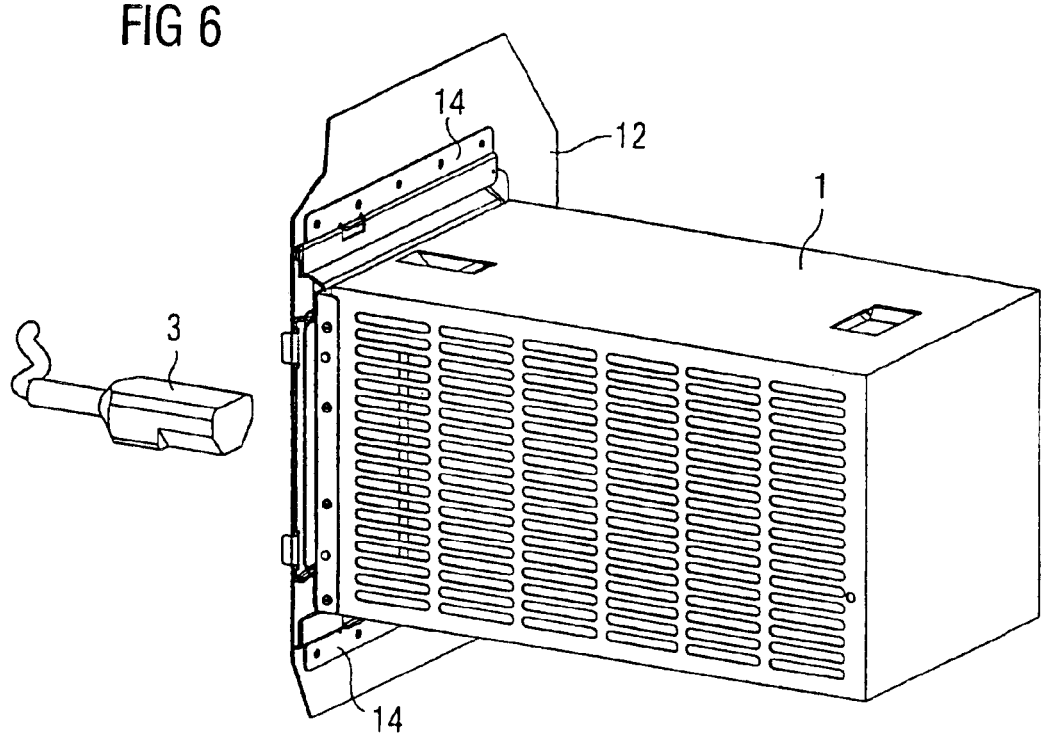
FIG. 6 is a perspective view of the power supply, as it is installed in the holder in an electronic appliance.
Figure 7:
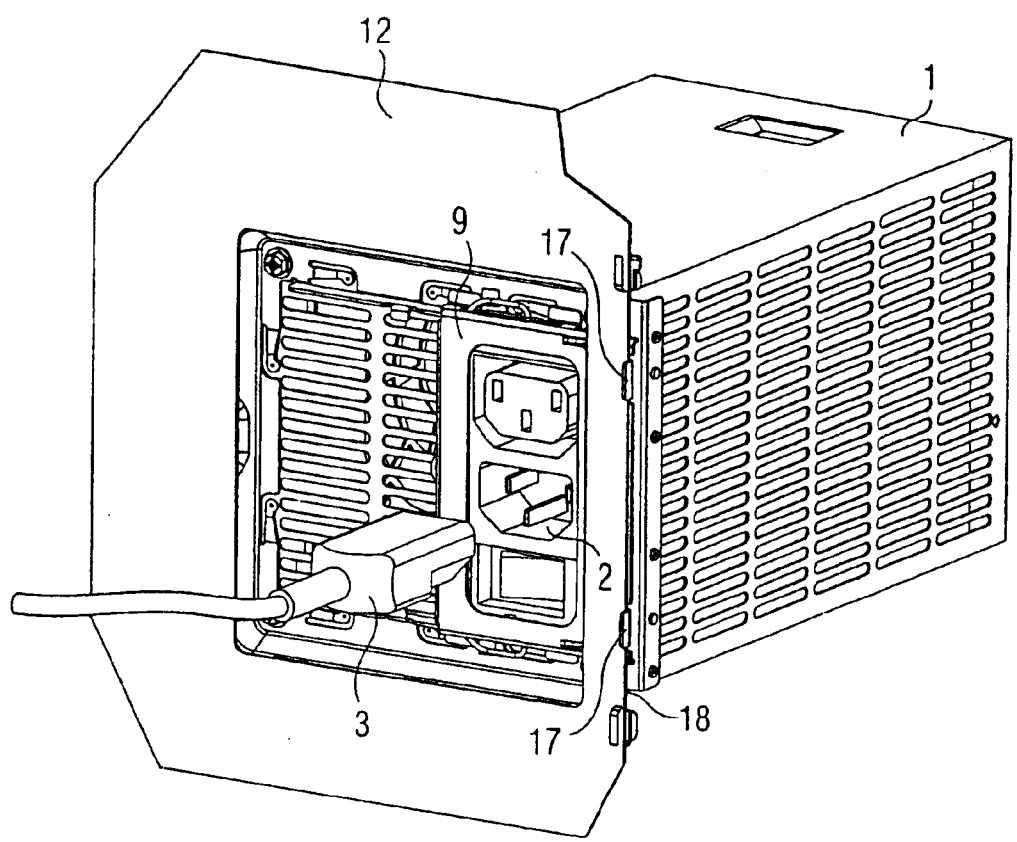
FIG. 7 is a perspective view, corresponding to FIG. 6, of the connection face of the power supply.

FIGS. 6 and 7 show the power supply 1 completely installed in the holder 12, in the form of an oblique view from the rear and an oblique view from the front. FIG. 7 shows how the side edge 18 in the holder 12 acts on the lug 17 of the slide 9. During removal of the power supply 1, this is once again pushed out onto the side of the edge 18, and the slide 9 is moved by the spring 10 to the locking position (see FIG. 5).

We claim:

1. A power supply to be inserted into and removed from an electrical appliance for installation or servicing purposes, the power supply comprising:

a female connector for receiving an electrical plug; and an insertion protection device moveable into a locking position for preventing insertion of the electrical plug into said female connector when the power supply is not installed in a correct location of the electrical appliance;

said insertion protection device being automatically released from the locking position when the power supply is inserted into the electrical appliance.

2. The power supply according to claim 1, further comprises a mounting rack, and said insertion protection device is a slide disposed in said mounting rack.

3. The power supply according to claim 2, wherein said slide at least partially covers said female connector when said slide is in a locked state.

4. The power supply according to claim 3, further comprising a spring acting on said slide for pushing said slide into the locking position, in which said female connector is at least partially covered by said slide.

5. The power supply according to claim 4, wherein said slide can be moved from the locking position only by applying force to said spring at two different positions.

6. The power supply according to claim 5, wherein the power supply can be inserted via said mounting rack into a holder of the electrical appliance.

7. The power supply according to claim 6, wherein the holder has a surface for acting on said spring for unlocking and, furthermore has an edge for pushing said slide out of the locking position.

8. The power supply according to claim 1, wherein said insertion protection device prevents removal of the power supply from the electrical appliance when the electrical plug is inserted in said female connector.

9. The power supply according to claim 1, wherein the power supply is used in a computer.

* * * * *